(12) United States Patent
Pey

(10) Patent No.: US 6,316,811 B1
(45) Date of Patent: Nov. 13, 2001

(54) SELECTIVE CVD TISI$_2$ DEPOSITION WITH TISI$_2$ LINER

(75) Inventor: Kin-Leong Pey, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/596,905

(22) Filed: Jun. 19, 2000

Related U.S. Application Data

(62) Division of application No. 09/094,465, filed on Jun. 11, 1998, now Pat. No. 6,100,118.

(51) Int. Cl.$^7$ .......................... H01L 29/76; H01L 29/94; H01L 31/062; H01L 31/113; H01L 31/119
(52) U.S. Cl. .......................... 257/368; 257/412; 257/382
(58) Field of Search .................................. 257/283–413, 257/900; 438/300–305, 585–592

(56) References Cited

U.S. PATENT DOCUMENTS

| | | | |
|---|---|---|---|
| 4,933,994 | 6/1990 | Orban | 437/44 |
| 5,023,201 | 6/1991 | Stanasolovich et al. | 437/192 |
| 5,593,924 | 1/1997 | Apte et al. | 437/200 |
| 5,668,024 | 9/1997 | Tsai et al. | 438/199 |
| 5,672,544 | 9/1997 | Pan | 437/200 |
| 5,744,395 | * 4/1998 | Shue et al. | 438/305 |
| 5,858,846 | * 1/1999 | Tsai et al. | 438/303 |
| 6,156,649 | * 12/2000 | Hause et al. | 438/592 |

FOREIGN PATENT DOCUMENTS

0724287A2 * 7/1996 (EP) .
409283464A * 10/1997 (JP) .

* cited by examiner

Primary Examiner—Tom Thomas
Assistant Examiner—Cuong Quang Nguyen
(74) Attorney, Agent, or Firm—George O. Saile; Rosemary L. S. Pike

(57) ABSTRACT

A method for improving the quality and uniformity of a silicide film in the fabrication of a silicided polysilicon gate and source/drain regions in an integrated circuit device is described. A polysilicon gate electrode is provided on the surface of a semiconductor substrate. Source and drain regions are formed within the semiconductor substrate adjacent to the gate electrode. A layer of titanium is deposited over the surfaces of the substrate. The substrate is annealed whereby the titanium layer is transformed into a first titanium silicide layer except where the titanium layer overlies the spacers. The titanium layer overlying the spacers is stripped to leave the first titanium silicide layer only on the top surface of the gate electrode and on the top surface of the semiconductor substrate overlying the source and drain regions. A second titanium silicide layer is selectively deposited on the first titanium silicide layer to complete formation of the silicided gate electrode and source and drain regions in the fabrication of an integrated circuit device. The first titanium silicide layer reduces or eliminates the effect of the polysilicon and silicon surface effects allowing for a higher quality and more uniform second titanium silicide layer.

4 Claims, 3 Drawing Sheets

SELECTIVE CVD TISI$_2$ DEPOSITION WITH TISI$_2$ LINER

This is a division of patent application Ser. No. 09/094,465, filing date Jun. 11, 1998, now U.S. Pat. No. 6,100,118 Selected Cvd Tisi2 Deposition with Tisi2 liner assigned to the same assignee as the present invention.

BACKGROUND OF THE INVENTION (1) Field of the Invention

The invention relates to the fabrication of integrated circuit devices, and more particularly, to a method of improving the quality and uniformity of a selective TiSi$_2$ deposition in the fabrication of integrated circuits.

(2) Description of the Prior Art

It is well known that it is very difficult to form a high quality uniform TiSi$_2$ film on narrow polysilicon lines, especially in deep sub-micron devices. One of the methods that has been used to overcome this technology barrier is to selectively deposit TiSi$_2$ onto the polysilicon and active silicon areas. The advantage of this approach is that there is no consumption of silicon at the source/drain regions.

Although selective CVD TiSi$_2$ is a promising technique, it has been found that the localized deposition rate is a strong function of the quality of the polysilicon and silicon surfaces—cleanliness, damage, etc. FIG. 1 illustrates a typical example of the effects that polysilicon etch damage on the sidewalls of the polysilicon line can have on the CVD TiSi$_2$ deposition. A polysilicon line 16 is shown on the surface of a semiconductor substrate 10. TiSi$_2$ 21 has been selectively deposited on the top surface of the polysilicon line. It can be seen that excess TiSi$_2$ 23 deposited at the edges of the polysilicon line due to polysilicon sidewall roughness. In practice, an insulating spacer will be formed on the sidewalls of the polysilicon line. However, the top portion of the spacers is etched away by wet chemicals leaving the top corners of the polysilicon line exposed. The roughness of the top corners of the lines causes the excess TiSi$_2$ deposition at the edges of the polysilicon lines.

U.S. Pat. No. 5,023,201 to Stanasolovich et al teaches forming a TiSi$_2$ layer on the substrate and then selectively depositing tungsten overlying the TiSi$_2$ and annealing to transform the TiSi$_2$ to the C54 phase. The process of Stanasolovich et al is not adequate for deep sub-micron polysilicon lines. U.S. Pat. No. 5,672,544 to Pan, U.S. Pat. No. 5,668,024 to Tsai et al, U.S. Pat. No. 5,593,924 to Apte et al, and U.S. Pat. No. 4,933,994 to Orban show other salicide processes using TiSi$_2$.

SUMMARY OF THE INVENTION

A principal object of the present invention is to provide an effective and very manufacturable method of fabricating a silicided polysilicon gate and source/drain regions in the fabrication of an integrated circuit.

A further object of the invention is to provide a method of improving the uniformity and quality of the silicide film in the fabrication of a silicided polysilicon gate.

Yet another object is to provide a method of siliciding a polysilicon gate and source and drain regions which will eliminate the effect of surface cleanliness, damage, or residues on the deposition rate of the silicide.

Yet another object is to provide a method of siliciding a polysilicon gate and source/drain regions wherein the surface quality of the underlying polysilicon or silicon is not a factor in the quality of the silicide.

A still further object of the present invention is to provide an effective and very manufacturable method of fabricating a silicided polysilicon gate and source/drain regions for deep sub-micron devices in the fabrication of an integrated circuit.

In accordance with the objects of this invention a method for improving the quality and uniformity of a silicide film in the fabrication of a silicided polysilicon gate and source/drain regions in an integrated circuit device is achieved. A polysilicon gate electrode is provided on the surface of a semiconductor substrate. Source and drain regions are formed within the semiconductor substrate adjacent to the gate electrode. A layer of titanium is deposited over the surfaces of the substrate. The substrate is annealed whereby the titanium layer is transformed into a first titanium silicide layer except where the titanium layer overlies the spacers. The titanium layer overlying the spacers is stripped to leave the first titanium silicide layer only on the top surface of the gate electrode and on the top surface of the semiconductor substrate overlying the source and drain regions. A second titanium silicide layer is selectively deposited on the first titanium silicide layer to complete formation of the silicided gate electrode and source and drain regions in the fabrication of an integrated circuit device. The first titanium silicide layer reduces or eliminates the effect of the polysilicon and silicon surface effects allowing for a higher quality and more uniform second titanium silicide layer.

Also in accordance with the objects of this invention, an integrated circuit device having a silicided polysilicon gate with improved silicide quality and uniformity is achieved. The integrated circuit device of the present invention comprises a polysilicon gate electrode on the surface of a semiconductor substrate, source and drain regions within the semiconductor substrate adjacent to the polysilicon gate electrode, and dielectric spacers on the sidewalls of the gate electrode. A lining silicide layer overlies the top surface of the gate electrode and the surface of the semiconductor substrate overlying the source and drain regions. A second silicide layer overlies the lining silicide layer. A patterned conducting layer contacts the silicided gate electrode and source and drain regions through openings in an overlying insulating layer to complete the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
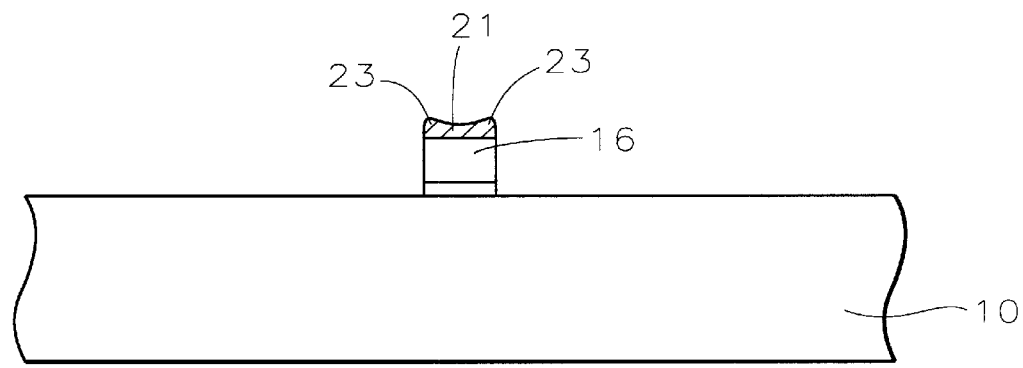
FIG. 1 schematically illustrates in cross-sectional representation an embodiment of the prior art.
Figure 2:
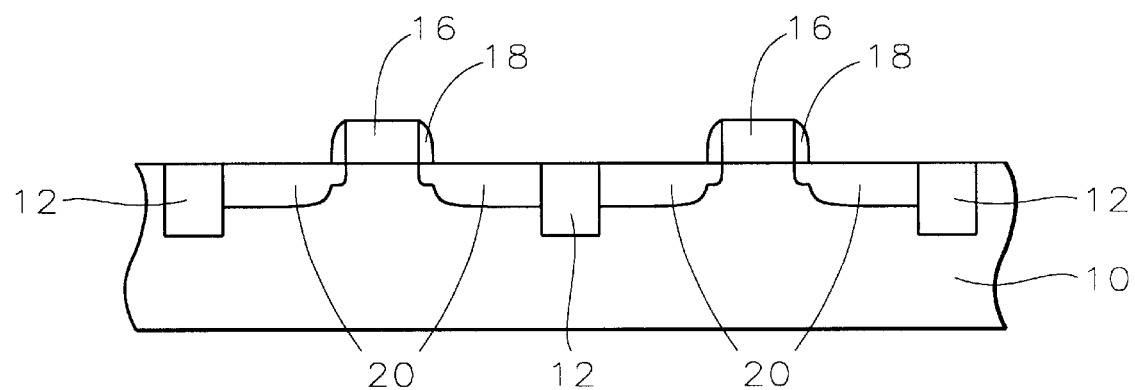
FIGS. 2 through 6 schematically illustrate in cross-sectional representation a preferred embodiment of the present invention.

Referring now more particularly to FIG. 2, there is shown an illustration of a portion of a partially completed integrated circuit. The semiconductor substrate 10 is preferably composed of silicon having a (100) crystallographic orientation. Isolation regions are formed as is conventional in the art to isolate active regions from one another. For example, shallow trench isolation or field oxide regions may be formed. FIG. 1 shows shallow trench isolation (STI) regions 12.

Semiconductor device structures are now formed in and on the semiconductor substrate in the active regions as is conventional in the art. Polysilicon gate electrodes 16 are formed over a gate oxide layer, not shown, on the surface of the substrate. Dielectric spacers 18 are formed on the sidewalls of the polysilicon gate electrodes. Source and drain regions 20 are formed within the semiconductor substrate adjacent the gate electrodes.

Now the silicided polysilicon gate and source/drain regions of the present invention will be formed. First, a pre-deposition cleaning of the substrate surface is performed. Typically, this is done by diluted hydrofluoric acid (DHF) to remove residual and native oxide on the polysilicon and silicon surfaces.

Figure 3:
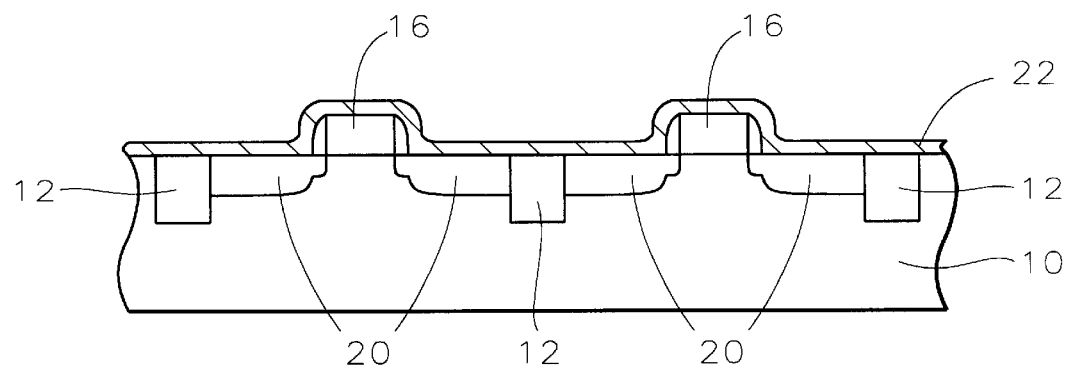
Figure 4:
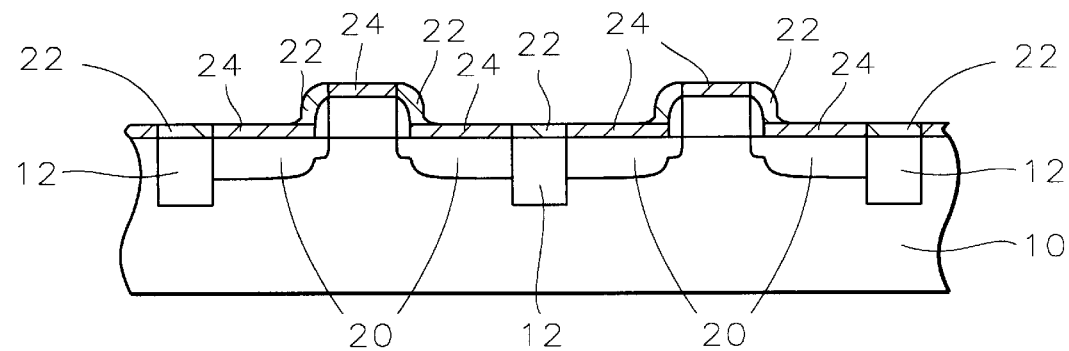

Next, as illustrated in FIG. 3, a very thin layer of titanium 22 is deposited over the surface of the substrate. This titanium layer has a thickness of between about 50 and 150 Angstroms. The substrate is annealed at a temperature of between about 700 and 750° C. for 30 to 60 seconds. The titanium 22 overlying the polysilicon and silicon surfaces will react with the underlying silicon to form a high resistivity C49 phase $TiSi_2$ film, as shown by 24 in FIG. 4. Since 1 Angstrom of titanium requires 2.2 Angstroms of silicon to form $TiSi_2$, silicon consumption at the source/drain will be less than 330 Angstroms for a titanium layer 150 Angstroms thick. This is an acceptable loss for very shallow junctions. The consumption of silicon can be reduced further if a thinner titanium layer is used.

Figure 5:
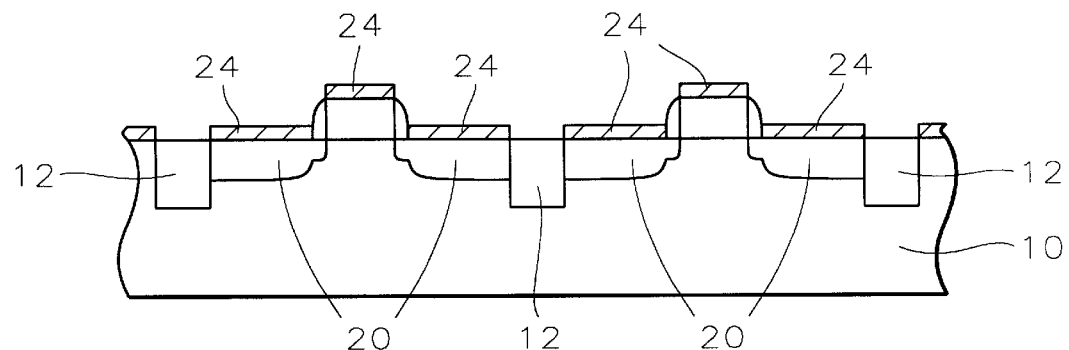

The unreacted titanium 22 is etched away to leave a $TiSi_2$ liner 24 on the polysilicon and source/drain surfaces, as shown in FIG. 5.

Figure 6:
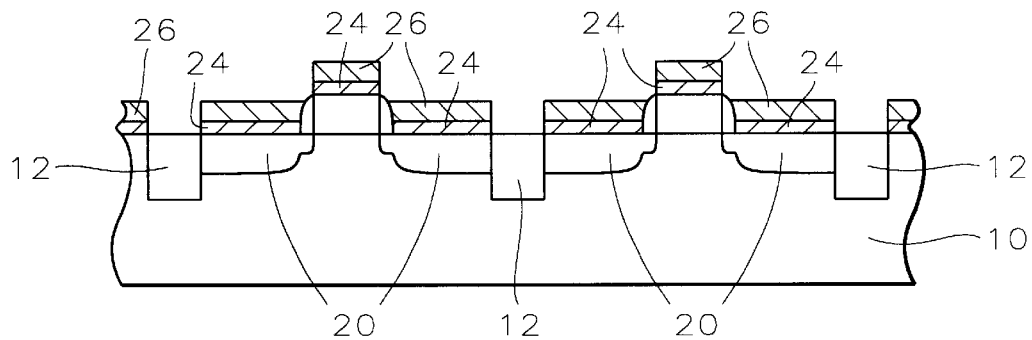

Referring now to FIG. 6, a layer 26 of phase C54 $TiSi_2$ is selectively deposited by chemical vapor deposition (CVD) on the $TiSi_2$ liner 24 to a thickness of between about 400 and 600 Angstroms. A deposition temperature of 650 to 750° C. assures the deposition of C54 phase $TiSi_2$.

This completes the formation of the silicided polysilicon gate and source/drain regions. No phase transform annealing is necessary because the CVD $TiSi_2$ layer 26 has the low resistivity C54 phase as deposited. Because of the $TiSi_2$ liner layer 24, the selective deposition of the $TiSi_2$ layer 26 is less dependent upon the cleanliness of the underlying polysilicon and silicon surfaces. Therefore, an improved silicide layer having high quality and uniformity and with minimum consumption of silicon is achieved.

An advantage of CVD TiSi2 is its self-aligned capabilities; that is, its very high selectivity to silicon dioxide and silicon nitride. Other materials can be used for the liner layer 24 provided they have high selectivity between the layer 26 and the dielectric. Similarly, other materials, such as tungsten, may be used for the layer 26 if they provide good selectivity between the silicon and the silicon dioxide and silicon nitride.

Figure 7:
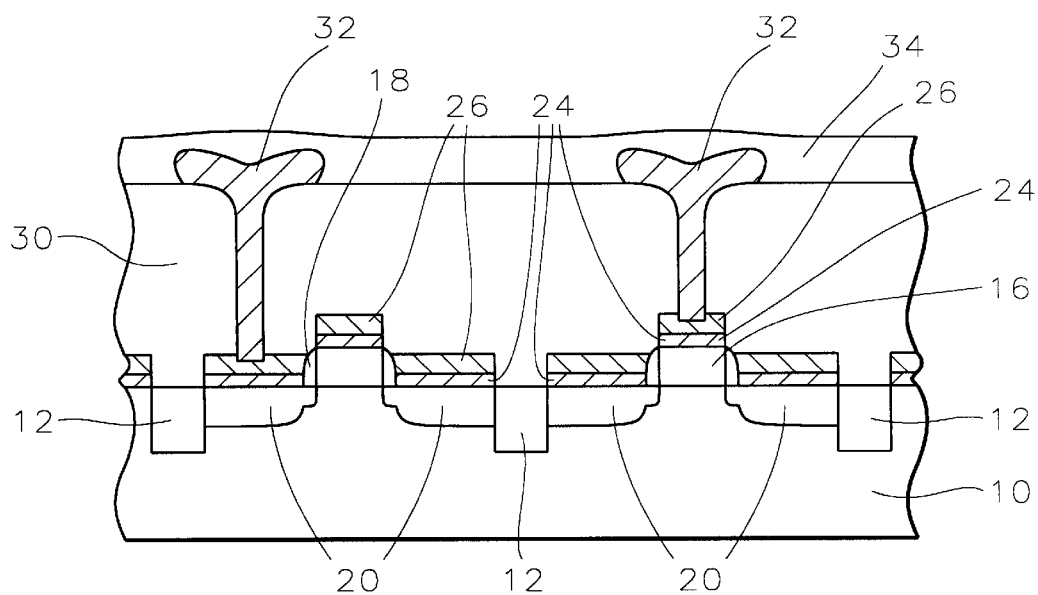
FIG. 7 schematically illustrates in cross-sectional representation a completed integrated circuit device fabricated according to a preferred embodiment of the present invention.

The integrated circuit device is completed as is conventional in the art. For example, as illustrated in FIG. 7, an insulating layer, such as silicon oxide or borophospho-TEOS (BPTEOS) 30 is blanket deposited over the semiconductor substrate and then planarized, for example, by chemical mechanical polishing (CMP). Openings are etched through the insulating layer to the underlying titanium silicide layer where electrical contact is to be made to polysilicon lines and source and drain regions. A conducting layer 32 is deposited and patterned to complete the electrical connections. A passivation layer 34 completes the fabrication of the integrated circuit device.

The process of the invention provides an effective method of fabricating an integrated circuit device having a silicided polysilicon gate and source/drain regions. By first forming a thin $TiSi_2$ lining layer, the effect of the polysilicon and silicon surface conditions can be minimized or eliminated, resulting in a high quality, uniform selective CVD $TiSi_2$ silicide layer.

In accordance with another aspect of the present invention, an integrated circuit device having an improved CVD $TiSi_2$ layer is described with reference to FIG. 7. Polysilicon gate electrodes 16 have been formed on a semiconductor substrate 10. Source and drain regions 20 lie within the semiconductor substrate adjacent to the gate electrodes 16. Dielectric spacers 18 lie on the sidewalls of the gate electrodes. A lining TiSi2 layer 24 overlies the top surface of the gate electrodes and the surfaces of the substrate overlying the source and drain regions. Silicide layer 26 overlies the lining layer 24. A thick insulating layer 30 covers the semiconductor substrate and the gate electrodes. A patterned conducting layer 32 extends through openings in the thick insulating layer 30 to contact the silicide layer overlying the gate electrode 16 and the source and drain regions 20. A passivation layer 34 overlies the insulating layer 30 and the patterned conducting layer 32.

While the invention has been particularly shown and described with reference to the preferred embodiments thereof, it will be understood by those skilled in the art that various changes in form and details may be made without departing from the spirit and scope of the invention.

What is claimed is:

1. An integrated circuit device comprising:

a polysilicon gate electrode on the surface of a semiconductor substrate;

source and drain regions within said semiconductor substrate adjacent to said polysilicon gate electrode;

dielectric spacers on the sidewalls of said gate electrode;

a lining silicide layer on the top surface of said gate electrode and on the surface of said semiconductor substrate overlying said source and drain regions wherein said lining silicide layer comprises titanium silicide having a high resistance phase C49;

a silicide layer overlying said lining silicide layer wherein said silicide layer comprises titanium silicide having a low resistance phase C54;

an insulating layer overlying said polysilicon gate electrode and said semiconductor substrate; and a conducting layer contacting said gate electrode and said source and drain regions through openings in said insulating layer to complete electrical connections in said integrated circuit device.

2. The device according to claim 1 wherein said polysilicon gate electrode has a width within the deep sub-micron regime.

3. The device according to claim 1 wherein said lining silicide layer has a thickness of between about 50 and 150 Angstroms.

4. The device according to claim 1 wherein said silicide layer has a thickness of between about 400 and 600 Angstroms.

* * * * *